(12) United States Patent
Wang et al.

(10) Patent No.: US 12,278,306 B2
(45) Date of Patent: Apr. 15, 2025

(54) METHOD FOR MANUFACTURING SOLAR CELL, SOLAR MODULE, AND POWER GENERATION SYSTEM

(71) Applicant: Solarlab Aiko Europe GmbH, Freiburg (DE)

(72) Inventors: Yongqian Wang, Yiwu (CN); Wenli Xu, Yiwu (CN); Wei Zhu, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 17/860,092

(22) Filed: Jul. 7, 2022

(65) Prior Publication Data
US 2023/0290901 A1 Sep. 14, 2023

(30) Foreign Application Priority Data
Mar. 11, 2022 (CN) .......................... 202210239657.8

(51) Int. Cl.
C25D 7/12 (2006.01)
C25D 17/00 (2006.01)
(Continued)

(52) U.S. Cl.
CPC ............ H01L 31/206 (2013.01); C25D 7/126 (2013.01); C25D 17/001 (2013.01); H01L 21/2885 (2013.01); H01L 21/6723 (2013.01)

(58) Field of Classification Search
None
See application file for complete search history.

(56) References Cited

U.S. PATENT DOCUMENTS 3,599,060 A * 8/1971 Triggs .................... H01L 24/01
257/E21.174
5,580,665 A * 12/1996 Taguchi .................. C22C 1/047
428/548
(Continued)

FOREIGN PATENT DOCUMENTS

CN 102779905 A 11/2012
CN 104178787 A 12/2014
(Continued)

OTHER PUBLICATIONS

Kluska et al. "Plated TOPCon solar cells & modules with reliable fracture stress and soldered module interconnection", EPJ Photovoltaics, 12, 10, 2021. (Year: 2021).*
(Continued)

Primary Examiner — Stefanie S Wittenberg
(74) Attorney, Agent, or Firm — MATTHIAS SCHOLL P.C.; Matthias Scholl

(57) ABSTRACT

The disclosure discloses a method for manufacturing a solar cell, a solar module, and a power generation system. The manufacturing method includes the following steps: S1: perforating film layer in a first region and/or a second region of a solar cell where an electrode is to be disposed, thus forming a plurality holes; S2: growing a plurality seed layers on the solar cell, contacting with the first region and/or the second region through the plurality of holes or grooves in S1; and S3: horizontally transporting a to-be-electroplated solar cell on a horizontal electroplating device, to form a cathode on the seed layer, where an anode terminal is disposed in an electroplating liquid in an electroplating bath, and a moving mechanism disposed in the electroplating bath drives the solar cell to move from inlet to outlet, thus achieving electroplating.

22 Claims, 9 Drawing Sheets

(51) Int. Cl.
*H01L 21/288* (2006.01)
*H01L 21/67* (2006.01)
*H01L 31/20* (2006.01)

(56) References Cited

U.S. PATENT DOCUMENTS

| | | | |
|---|---|---|---|
| 9,773,928 B2* | 9/2017 | Fu | H01L 31/068 |
| 9,947,812 B2* | 4/2018 | Harley | H01L 31/0516 |
| 2006/0189129 A1* | 8/2006 | Baskaran | H01L 21/76873 |
| | | | 257/E21.174 |
| 2008/0128019 A1 | 6/2008 | Lopatin et al. | |
| 2009/0235983 A1* | 9/2009 | Girt | H01L 31/03926 |
| | | | 136/258 |
| 2011/0041911 A1 | 2/2011 | Lee et al. | |
| 2012/0255602 A1* | 10/2012 | Schmidt | H01L 31/0236 |
| | | | 438/609 |
| 2015/0280027 A1* | 10/2015 | Moors | H01L 31/022441 |
| | | | 438/85 |
| 2016/0181447 A1* | 6/2016 | Kim | B23K 26/354 |
| | | | 136/256 |
| 2016/0181450 A1* | 6/2016 | Cudzinovic | H01L 31/022425 |
| | | | 136/256 |
| 2017/0077343 A1* | 3/2017 | Morad | H01L 31/0747 |

FOREIGN PATENT DOCUMENTS

| | | | |
|---|---|---|---|
| CN | 108660500 | * 10/2018 | C25D 17/00 |
| CN | 108807565 A | 11/2018 | |
| CN | 109148616 A | 1/2019 | |
| DE | 102018202513 | * 8/2019 | H01L 21/28 |
| TW | 201442260 A | 11/2014 | |

OTHER PUBLICATIONS

Jian Yu et al., Copper metallization of electrodes for silicon heterojunction solar cells: Process, reliability and challenges, Solar Energy Materials and Solar Cells, Feb. 18, 2021, pp. 110993, vol. 224, Elsevier, Netherlands.

* cited by examiner

METHOD FOR MANUFACTURING SOLAR CELL, SOLAR MODULE, AND POWER GENERATION SYSTEM

CROSS-REFERENCE TO RELATED APPLICATIONS

Pursuant to 35 U.S.C. § 119 and the Paris Convention Treaty, this application claims foreign priority to Chinese Patent Application No. 202210239657.8 filed Mar. 11, 2022, the contents of which, including any intervening amendments thereto, are incorporated herein by reference.

BACKGROUND

The disclosure relates to the field of solar cells, and more particularly, to a method for manufacturing a solar cell, a solar module, and a power generation system.

In the prior art, an electrode manufacturing method of a solar cell generally includes the following steps.

Step 1: texturing a surface of an N-type silicon wafer by using a wet chemical method;

Step 2: making an emitter on a front side of the N-type silicon wafer;

Step 3: depositing a tunnel oxide layer on a back side of the N-type silicon wafer, and then depositing doped polysilicon on the tunnel oxide layer;

Step 4: performing double-sided coating on the N-type silicon wafer;

Step 5: performing film perforation on the front side and the back side of the N-type silicon wafer by laser to form an electrode predisposing region and an electroplating needle press-in area at the same time; and Step 6: Clamping, by using an electroplated electrode, the electroplating needle-contacted area on the front side and the back side of a cell for groove-shaped electroplating.

The width of the electrode manufactured by using the above method is limited by a film perforation size by laser. The film perforation by laser introduces some damage, and therefore a larger film perforation size by laser leads to more serious laser damage. In addition, when the electrode is on the front side, incidence of sunlight is blocked, and if the electrode width is excessively wide, conversion efficiency of the cell is reduced. However, a small film perforation size by laser may also cause problems, including: 1) A smaller electrode width easily causes the finger to fall off. 2) A smaller electrode width leads to larger line resistance of the electrode, which affects the conversion efficiency of the cell. Ideally, a larger electrode width leads to smaller line resistance of the solar cell, which is more conducive to enhancement of efficiency of the solar cell. Therefore, how to solve a contradiction between the width of the electrode manufactured by using the above method and the film perforation size by laser becomes a problem to be urgently solved in the technical field of manufacturing the solar cell.

Moreover, the above existing electrode manufacturing method adopts a vertical electroplating method. The vertical electroplating cannot electroplate the solar cell in a streamlined manner. Therefore, the electroplating efficiency is low compared with horizontal electroplating, and it is difficult to satisfy the requirement for scale electroplating of the solar cell. In addition, an electrode pressure point during the vertical electroplating blocks an electroplating reaction, which affects the appearance and conversion efficiency of the cell.

SUMMARY

The disclosure provides a method for manufacturing a solar cell, a solar module, and a power generation system, so as to ensure an electrode width of a solar cell, prevent a finger from falling off, and satisfy a requirement for scale electroplating without affecting a film perforation size.

To achieve the objective, the disclosure adopts the following technical solution.

A method for manufacturing a solar cell is provided, the method comprising:

step S1: perforating a film layer in a first region and/or a second region of a solar cell where an electrode is to be disposed, thus forming a plurality of holes or grooves;

step S2: growing a seed layer on the solar cell, where the seed layer comes into conductive contact with the first region and/or the second region through the plurality of holes or grooves in step S1; and step S3: horizontally transporting a to-be-electroplated solar cell, where a cathode electroplating brush is in contact with the seed layer on the horizontally transmitted solar cell, to form a cathode of an electroplating system on the seed layer, an anode terminal is disposed in an electroplating liquid in an electroplating bath, and a moving mechanism disposed in the electroplating bath drives the solar cell to move from an inlet to an outlet of the moving mechanism of the solar cell, thus achieving electroplating of the solar cell during energization and the horizontal transmission.

Preferably, the first region and the second region are covered with a tunnel oxide layer and a polysilicon layer.

Preferably, the seed layer is grown on the solar cell by means of physical vapor deposition.

Preferably, in step S2, a transparent conductive oxide (TCO) thin film is grown by means of physical vapor deposition before the seed layer is grown.

Preferably, when the first region and the second region on the solar cell both exist on a back side of a silicon wafer, the manufacturing method further comprises:

step S4: manufacturing a mask in an electroplated electrode region on an electroplated sample, then etching the electroplated sample, and then forming insulation between electroplated electrodes in the first region and the second region.

Preferably, when the first region and the second region on the solar cell both exist on a back side of a silicon wafer, between step S2 and step S3, the method further comprises: forming a mask on the seed layer, to achieve physical isolation of electroplating layers in the first region and the second region.

Preferably, after step S3, the method further comprises: removing the mask layer on the seed layer, and then performing wet chemical etching to remove the seed layer, to form insulation between electroplated electrodes in the first region and the second region.

Preferably, when the first region and the second region on the solar cell both exist on a back side of a silicon wafer, after step S2, the method further comprises:

step B1: forming a mask on the seed layer, and then performing wet chemical etching to realize insulation between the seed layers in the first region and the second region; and step B2: removing the mask on the seed layer.

Preferably, when the first region and the second region on the solar cell both exist on a back side of a silicon wafer, in step S2, the mask is used, on the solar cell, to form a patterned electroplating seed layer grown by means of physical vapor deposition, to realize insulation between the seed layers in the first region and the second region.

Preferably, the TCO thin film is also removed during removal of the seed layer by means of the wet chemical etching.

Preferably, the solar cell where an electrode is to be disposed is manufactured by using the following steps:
- step L1: texturing a surface of a silicon wafer;
- step L2: depositing the tunnel oxide layer on a back side of the silicon wafer, and then depositing first doped polysilicon having a first polarity on the tunnel oxide layer;
- step L3: depositing a first mask on the first doped polysilicon;
- step L4: retaining the first mask predisposed in the first region on the back side of the silicon wafer, and removing the first mask predisposed in the second region on the back side of the silicon wafer;
- step L5: removing the first doped polysilicon and the tunnel oxide layer deposited in the second region, and then manufacturing a second mask in the second region again;
- step L6: depositing the tunnel oxide layer in the second region, and then depositing second doped polysilicon having a second polarity on the tunnel oxide layer in the second region;
- step L7: manufacturing a third mask on the second doped polysilicon deposited in the second region;
- step L8: retaining the third mask in a non-GAP region in the second region, and removing the third mask outside a GAP region in the second region;
- step L9: removing, by using a wet chemical method, the second mask deposited in the first region, a material layer above the second mask, and the tunnel oxide layer and the second doped polysilicon deposited in the GAP region on the back side of the silicon wafer; and
- step L10: performing double-sided coating on the silicon wafer to obtain the solar cell where the electrode is to be disposed.

Preferably, the seed layer comprises a main component and an improved component. The main component is one or more metals having an average refractive index lower than 2 and a wavelength in a range of 850-1200 nm, and the improved component comprises any one or more of Mo, Ni, Ti, or W.

Preferably, the main component comprises any one or more of Al, Ag, Cu, or Mg.

Preferably, the improved component further comprises a non-metallic composition.

Preferably, a content of the main component is greater than 50 wt. % of the seed layer.

Preferably, the main component is Al having a content greater than or equal to 70 wt. % of the seed layer. The improved component is Ni having a content less than or equal to 30 wt. % of the seed layer.

Preferably, the main component is Al having a content greater than or equal to 70 wt. % of the seed layer. The improved component is W having a content less than or equal to 30 wt. % of the seed layer.

Preferably, the main component is Al having a content greater than or equal to 70 wt. % of the seed layer. The improved component is Ti having a content less than or equal to 30 wt. % of the seed layer.

Preferably, the main component is Al having a content greater than or equal to 70 wt. % of the seed layer. The improved component is Mo having a content less than or equal to 30 wt. % of the seed layer.

Preferably, the main component is Al having a content greater than or equal to 70 wt. % of the seed layer. The improved component is Cr having a content less than or equal to 30 wt. % of the seed layer. Preferably, the main component is Al having a content greater than or equal to 70 wt. % of the seed layer. The improved component is Si having a content less than or equal to 30 wt. % of the seed layer.

Preferably, the seed layer is formed on the substrate by using any of manufacturing methods such as physical vapor deposition, screen printing, chemical vapor deposition, electroplating, or chemical plating.

Preferably, the seed layer is also covered with a conductive layer.

Preferably, the conductive layer comprises any one or more of Cu, Ag, or Al.

Preferably, a passivation film is formed between the seed layer and a semiconductor region where an electrode is disposed. An opening is provided on the passivation film, and the seed layer comes into contact with the semiconductor region through the opening.

Preferably, a TCO thin film is further disposed between the seed layer and the passivation film, and the TCO thin film comes into contact with the semiconductor region through the opening provided on the passivation film.

Preferably, the TCO thin film is an indium tin oxide or a zinc oxide-based thin film.

Preferably, the semiconductor region comprises a tunnel oxide layer and doped polysilicon.

Preferably, a method for growing the conductive layer on the seed layer comprises any of electroplating, physical vapor deposition, screen printing, and chemical plating.

Preferably, an upper portion of the conductive layer is covered with a protective layer.

Preferably, the protective layer is an Sn layer or an Ag layer.

Preferably, the protective layer is grown on the conductive layer by electroplating or chemical plating.

Preferably, the seed layer is formed by stacking a plurality of sub-seed layers.

Preferably, contents of main components in the sub-seed layers stacked along a direction facing away from the substrate gradually decrease.

The disclosure further provides a solar cell, which is manufactured by using the manufacturing method.

The disclosure further provides a solar module, which is formed by electrically connecting a plurality of solar cells manufactured by using the manufacturing method.

The disclosure further provides a solar power generation system, comprising a plurality of solar modules that are electrically connected.

The disclosure has the following two beneficial effects.

1. The film layer is perforated in the first region and/or the second region of the solar cell where the electrode is to be disposed, and the seed layer is grown on the solar cell. The seed layer comes into conductive contact with the first region and/or the second region through the hole, which solves the contradiction between the electrode width and the damage of the film perforation. In this way, the electrode width may be greatly increased. On the one hand, the line resistance of the solar cell is reduced, and on the other hand, the problem that the finger falls off easily caused by an excessively narrow line width of the electroplated electrode for a long time is solved.

2. Streamlined electroplating is performed, by using the self-developed horizontal electroplating device, on a to-be-electroplated solar cell for which growth of the seed layer has been completed. In this way, the problem that scale electroplating is not applicable due to low efficiency of electroplating by vertical electroplating existing in the prior art is solved.

BRIEF DESCRIPTION OF THE DRAWINGS

To describe the technical solutions in the embodiments of the disclosure more clearly, the following briefly describes the accompanying drawings required for describing the embodiments of the disclosure. Obviously, the accompanying drawings in the following descriptions are merely some embodiments of the invention, and a person of ordinary skill in the art may further obtain other accompanying drawings according to the accompanying drawings without creative efforts.

DETAILED DESCRIPTION

Figure 1:
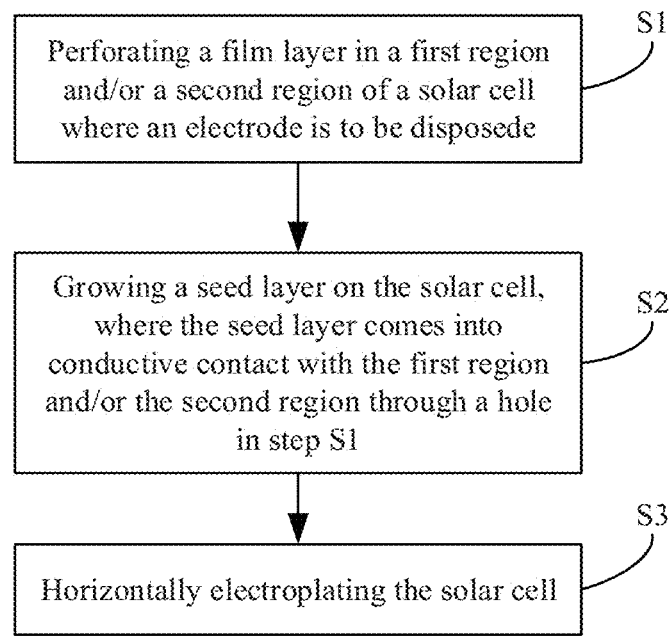
FIG. 1 is a diagram of steps for implementing a method for manufacturing a solar cell according to an embodiment of the disclosure.

The technical solution of the disclosure is further described below with reference to the accompanying drawings and by using specific implementations.

The accompanying drawings are only used for exemplary description, are only schematic diagrams instead of physical drawings, and should not be construed as a limitation on this patent. In order to better describe the embodiments of the disclosure, some components in the accompanying drawings are omitted, enlarged, or reduced, which do not represent a size of an actual product. It may be understood by those skilled in the art that some well-known structures and descriptions thereof in the accompanying drawings may be omitted.

Same or similar reference numerals in the accompanying drawings of the embodiments of the disclosure correspond to same or similar components. In the description of the disclosure, it should be understood that if orientation or positional relationships indicated by the terms "up", "down", "left", "right", "inside", "outside" and the like are based on orientation or positional relationships shown in the accompanying drawings, and are used only for ease and brevity of the description of the disclosure, rather than indicating or implying that the mentioned apparatus or component needs to have a particular orientation or needs to be constructed and operated in a particular orientation. Therefore, the terms for describing positional relationships are for illustrative purposes only, and should not be construed as a limitation on this patent. Those of ordinary skill in the art can understand specific meanings of the above terms according to specific situations.

In the description of the disclosure, unless otherwise explicitly specified and limited, if the term "connection" or the like indicating a connection relationship between components appears, the term should be understood in a broad sense. For example, the connection may be a fixed connection, a detachable connection, or an integral connection; or the connection may be a mechanical connection or an electrical connection; a direct connection, an indirect connection through an intermediate, or internal communication between two elements or an interaction relationship between two elements. The specific meanings of the above terms in the disclosure may be understood according to specific circumstances for a person of ordinary skill in the art.

Figure 3:
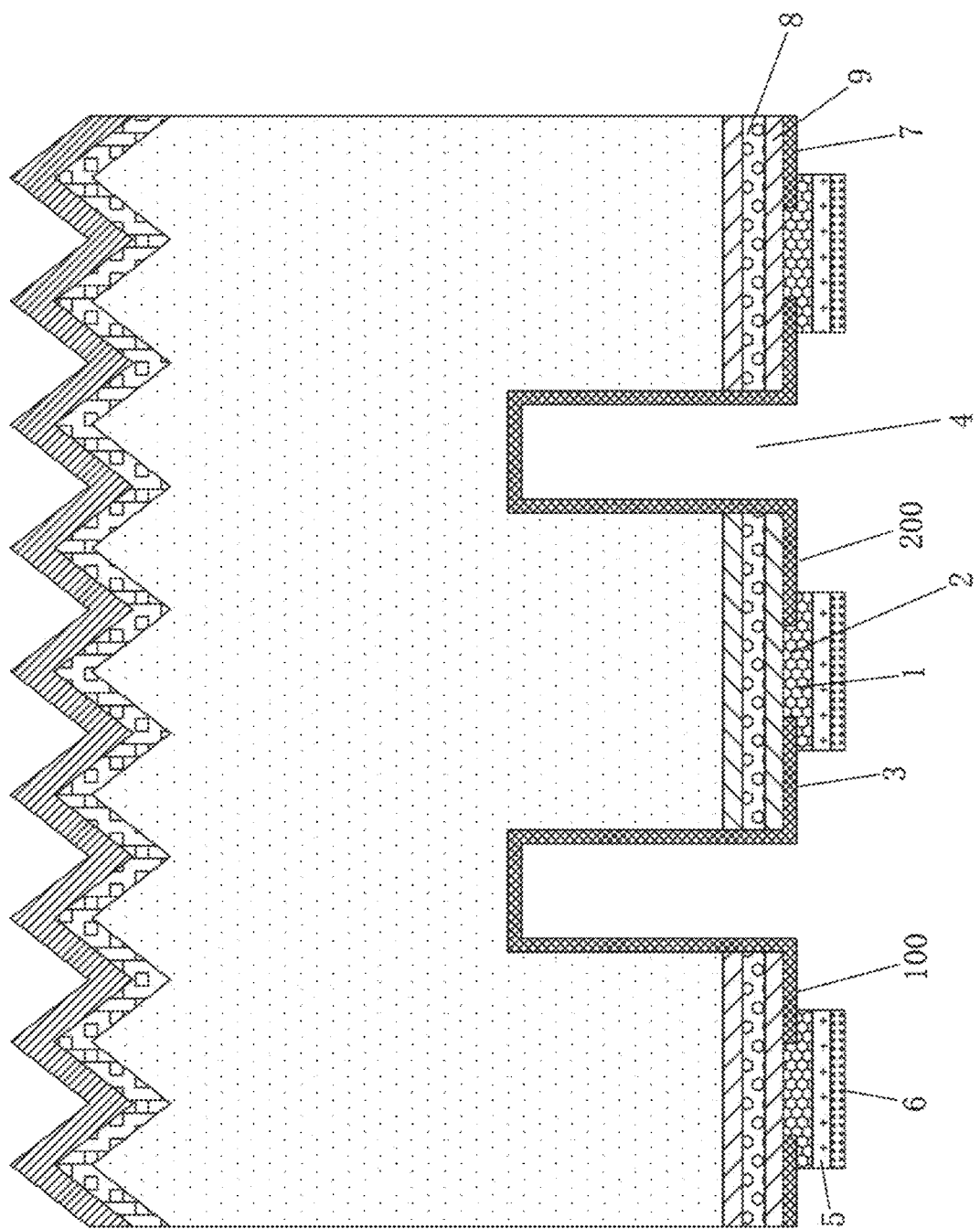
FIG. 3 is a schematic structural diagram of a manufactured solar cell.

A method for manufacturing a solar cell provided in an embodiment of the disclosure is shown in FIG. 1 and FIG. 3 and comprises the following steps.

Step S1: Perforating a film layer in a first region 100 and/or a second region 200 of a solar cell where an electrode is to be disposed, thus forming a plurality holes.

Step S2: Growing a seed layer 1 on the solar cell, where the seed layer 1 comes into conductive contact with the first region 100 and/or the second region 200 through the plurality of holes or grooves 2 in step S1.

Figure 4:
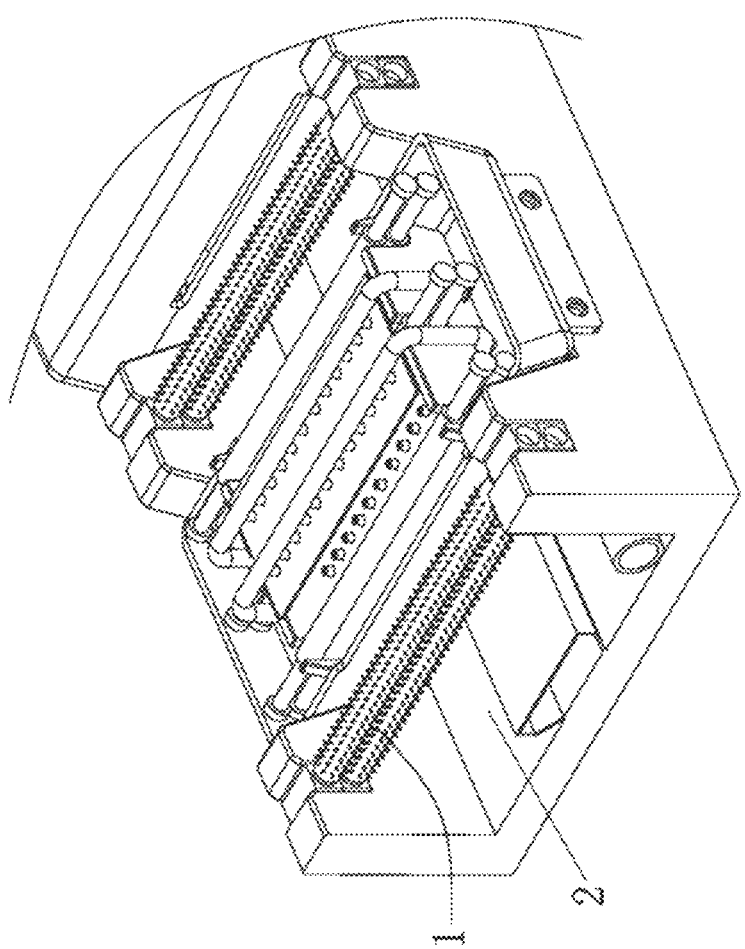
FIG. 4 is a structure diagram of a device configured to electroplate a solar cell in a horizontal transmission manner.

Step S3: Horizontally transporting, by using a horizontal electroplating device shown in FIG. 4, a to-be-electroplated solar cell, where a cathode electroplating brush 1 in FIG. 4 is in contact with the seed layer on the horizontally transmitted solar cell, to form a cathode of an electroplating system on the seed layer, an anode terminal is disposed in an electroplating liquid in an electroplating bath 2 shown in FIG. 4, and a moving mechanism disposed in the electroplating bath 2 drives the solar cell to move from an inlet to an outlet of the moving mechanism of the solar cell, thus achieving electroplating of the solar cell during energization and the horizontal transmission.

As shown in FIG. 3, according to the disclosure, the seed layer 1 comes into conductive contact with the first region 100 and/or the second region 200 through the hole 2 obtained by using step S1. In this way, the problem that an electrode width of the solar cell manufactured in the prior art is limited by a film perforation size is solved, which greatly increases the electrode width. On the one hand, the line resistance of the solar cell is reduced, and on the other hand, the problem that the finger falls off easily caused by an excessively narrow line width of the electroplated electrode for a long time is solved.

Preferably, in this embodiment, the seed layer is grown on the solar cell by means of physical vapor deposition (comprising sputtering and evaporation).

Since according to the disclosure, a large area of seed layer is grown in the solar cell where an electrode is to be disposed, which is convenient for the groove-shaped electroplated electrode to be clamped on the seed layer. In this way, the horizontal electroplating solution can be applied to the scale production of the solar cell. Introduction of the horizontal electroplating solution solves the existing problem of low production capacity of vertical electroplating, and also solves the problem of low electroplating efficiency caused by the lack of electrodes at an electroplated electrode press-in needle point of the and the large-area film perforation at the press-in needle point.

As shown in FIG. 3, when the first region 100 and the second region 200 on the solar cell both exist on a back side of a silicon wafer, preferably, between step S2 and step S3, the method further comprises: forming a mask on the seed layer 1, to achieve physical isolation of electroplating layers on the first region 100 and the second region 200. After the mask is formed on the seed layer, further, preferably, after step S3, the method further comprises: removing the mask layer on the seed layer, and then performing wet chemical etching to remove the seed layer, to form insulation between electroplated electrodes in the first region and the second region.

Preferably, when the first region and the second region on the solar cell both exist on a back side of a silicon wafer, after step S2, the method further comprises the following steps.

Step B1: Forming a mask on the seed layer, and then performing wet chemical etching to realize insulation between the seed layers in the first region and the second region.

Step B2: Removing the mask on the seed layer.

As another preferred solution, when the first region and the second region on the solar cell both exist on a back side of a silicon wafer, preferably, in step S2, the mask is used on the solar cell to form a patterned seed layer grown by physical vapor deposition (comprising sputtering and evaporation), to realize insulation between the seed layers in the first region and the second region.

Preferably, when the first region and the second region on the solar cell both exist on a back side of a silicon wafer, as shown in FIG. 1, the method for manufacturing the solar cell further comprises the following step.

Step S4: Manufacturing a mask in an electroplated electrode region on an electroplated sample, then etching the electroplated sample, and then forming insulation between electroplated electrodes in the first region and the second region.

Figure 2:
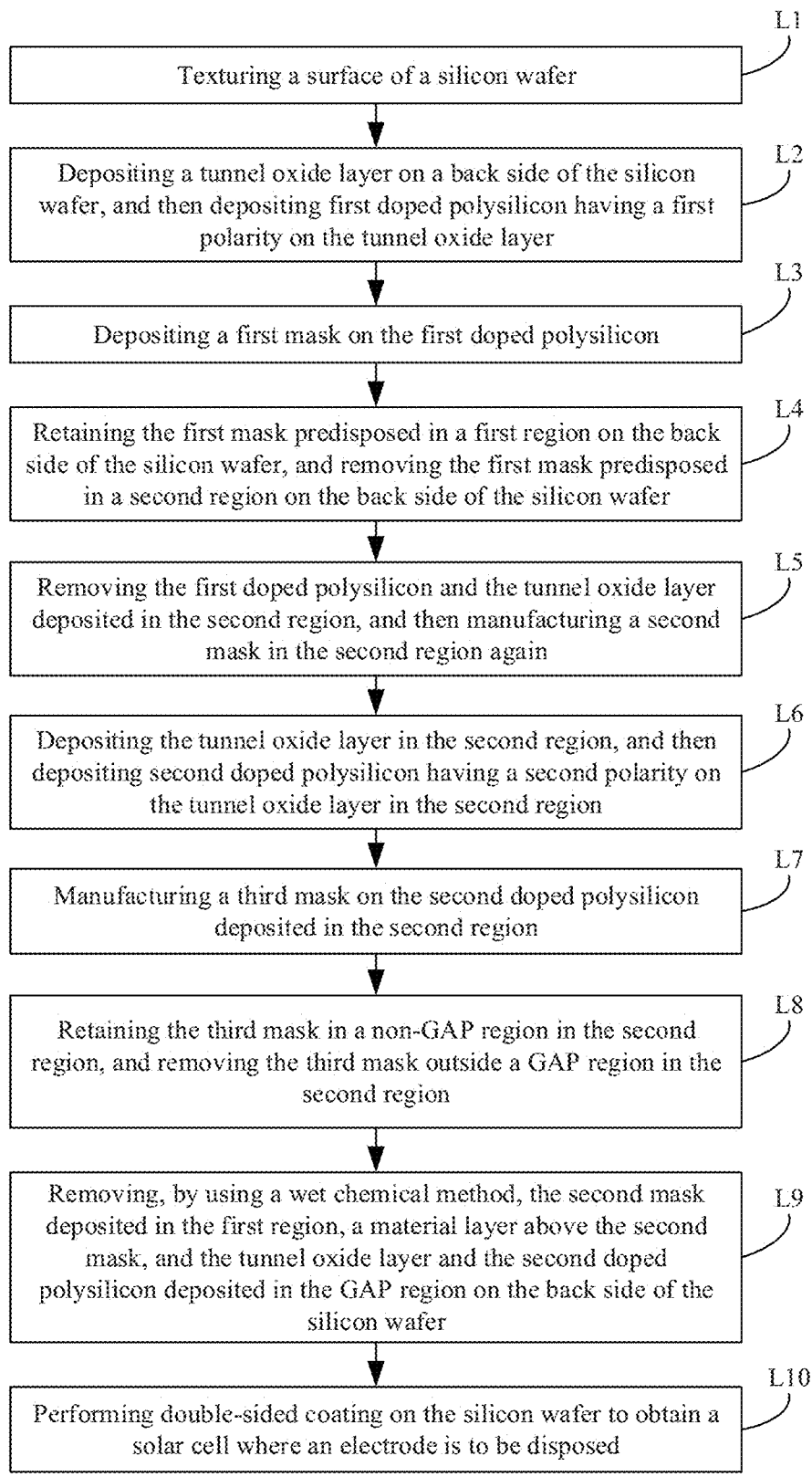
FIG. 2 is a diagram of steps of a method for manufacturing a solar cell where an electrode is to be disposed.

In this embodiment, as shown in FIG. 2, the solar cell where an electrode is to be disposed is manufactured by using the following steps.

Step L1: Texturing a surface of a silicon wafer.

Step L2: Depositing the tunnel oxide layer on a back side of the silicon wafer, and then depositing first doped polysilicon having a first polarity (a positive electrode or a negative electrode) on the tunnel oxide layer.

Step L3: Depositing a first mask on the first doped polysilicon.

Step L4: Retaining the first mask predisposed in the first region on the back side of the silicon wafer, and removing the first mask predisposed in the second region on the back side of the silicon wafer.

Step L5: Removing the first doped polysilicon and the tunnel oxide layer deposited in the second region, and then manufacturing a second mask in the second region again.

Step L6: Depositing the tunnel oxide layer in the second region, and then depositing second doped polysilicon having a second polarity on the tunnel oxide layer in the second region.

Step L7: Manufacturing a third mask on the second doped polysilicon deposited in the second region.

Step L8: Retaining a third mask in a non-GAP region (denoted by a reference numeral "3" in FIG. 3) in the second region, and removing the third mask outside a GAP region (denoted by a reference numeral "4" in FIG. 3) in the second region.

Step L9: Removing, by using a wet chemical method, the second mask deposited in the first region, a material layer above the second mask, and the tunnel oxide layer and the second doped polysilicon deposited in the GAP region on the back side of the silicon wafer.

Step L10: Performing double-sided coating on the silicon wafer to obtain the solar cell where the electrode is to be disposed.

In manufacturing the solar cell where an electrode is to be disposed, the disclosure blocks the particle bombardment during growing of the seed layer by physical vapor deposition by using a doped polysilicon layer, which is beneficial to enhance performance of the manufactured solar cell.

In the above technical solutions, the seed layer comprises a main component and an improved component. The main component is any one or more metals having an average refractive index lower than 2 and a wavelength in a range of 850-1200 nm (preferably any one or more of Al (aluminum), Ag (silver), Cu (copper), or Mg (magnesium)), and the improved component comprises any one or more of Mo (molybdenum), Ni (nickel), Ti (titanium), W (tungsten), Cr (chromium), Si (silicon), Mn (manganese), Pd (palladium), Bi (bismuth), Nb (niobium), Ta (tantalum), Pa (protactinium), or V (vanadium) content of the main component in the seed layer is preferably greater than 50 wt. % of the seed layer. More preferably, the main component is Al having a content greater than or equal to 70 wt. % of the seed layer, and the improved component is Ni having a content less than or equal to 30 wt. % of the seed layer. Alternatively, the main component is Al having a content greater than or equal to 70 wt. % of the seed layer, and the improved component is W having a content less than or equal to 30 wt. % of the seed layer. Alternatively, the main component is Al having a content greater than or equal to 70 wt. % of the seed layer, and the improved component is Ti having a content less than or equal to 30 wt. % of the seed layer. Alternatively, the main component is Al having a content greater than or equal to 70 wt. % of the seed layer, and the improved component is Mo having a content less than or equal to 30 wt. % of the seed layer. Alternatively, the main component is Al having a content greater than or equal to 70 wt. % of the seed layer, and the improved component is Cr having a content less than or equal to 30 wt. % of the seed layer. Alternatively, the main component is Al having a content greater than or equal to 70 wt. % of the seed layer, and the improved component is Si having a content less than or equal to 30 wt. % of the seed layer.

Ag paste is currently used as an electrode material in mass-produced crystalline silicon solar cells, and costs of Ag paste account for nearly 30% of costs of amorphous silicon cells. Reducing an amount of Ag or not using the production technology of Ag can effectively reduce production costs of the solar cells. Cu is a desirable substitute for Ag. Compared with Ag, Cu has the following advantages as the conductive material, as shown in the following Table a:

TABLE a

| Metal | Ag | Cu |
|---|---|---|
| Volume resistivity (ohm · cm) | 1.60E−06 | 1.70E−06 |
| Price (yuan/ton) | 5101000 | 70970 |

Figure 5:
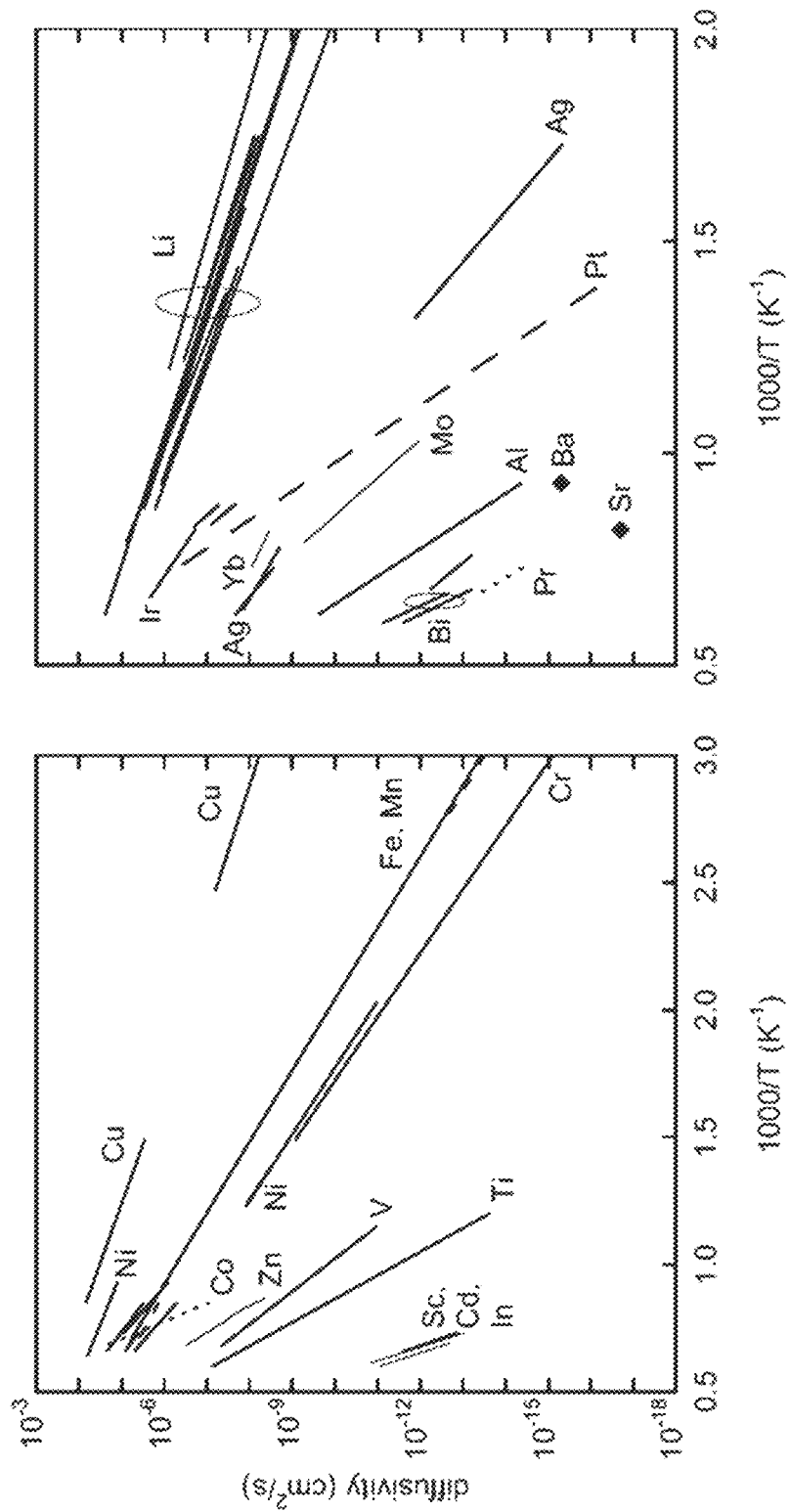
FIG. 5 is a comparison diagram of diffusion coefficients of Cu and other metals.

It may be learned from the above Table a that Cu has relatively stable chemical properties, excellent ductility, and sufficiently low volume resistivity, and a large number of such excellent characteristics are available at low prices (close to 1/72 of a price of Ag). In this way, Cu becomes an effective substitute for Ag. However, Cu has two important characteristics that limit the disclosure in the solar cell. The first characteristic is that Cu has a too large diffusion coefficient. FIG. 5 is a schematic diagram of diffusion coefficients of common metals. Horizontal coordinates and vertical coordinates in FIG. 5 respectively represent reciprocals of temperatures (by Kelvin K) and diffusion coefficients of metal elements. It can be seen from FIG. 5 that the diffusion coefficient of Cu is much higher than that of other metals, and is higher than that of Ag/Al, or the like by 5 orders of magnitude.

The second characteristic is that defects of Cu have a large capture cross-section for a hole, which greatly reduces a bulk lifetime and reduces electrical performance of the solar cell. The impact of the Cu content on the bulk lifetime and the battery performance is shown in Table b below:

TABLE b

| 3 ohm · cm n-type silicon wafer | | |
|---|---|---|
| Cu content (1/cm$^3$) | Bulk lifetime @1E15 | Impact on cell efficiency (%) |
| 0 | 33.25 | — |
| 1.00E+12 | 15.15 | −0.29 |
| 5.00E+12 | 4.48 | −1.35 |
| 1.00E+13 | 2.35 | −2.28 |
| 1.50E+13 | 1.49 | −2.81 |

It can be learned from the Table b that with an increase in the Cu content, the bulk lifetime is greatly reduced, and the cell efficiency is also greatly reduced. Even if there are only 1E12/cm$^3$ of Cu impurities, the cell efficiency is also reduced by 0.29%.

In the prior art, Ni (nickel) is generally used as a barrier layer for diffusion of Cu, and also can well adhere to the substrate and the Cu electrode. The general process of the implementation is: preparing a coated substrate-performing film perforation by laser-perform electroplating by using Ni-electroplating a Cu layer. However, during our research, it is found that Ni has a major defect as the barrier layer of Cu, that is, a relatively poor long-wavelength reflection effect, which reduces the light trapping effect of the cell and further reduces the conversion efficiency of the cell.

Comparison data of optical properties of the cell using Ni+Cu and Ag as electrode materials is shown in the following Table c:

TABLE c

| | Short-circuit current density of cell (J$_{sc}$/cm$^2$) | |
|---|---|---|
| | Experimental result | Optical simulation result |
| Ag electrode route | 42.09 | 42.12 |
| Ni + Cu | 40.73 | 41.37 |

It can be learned from the above Table c that a combination of Ni+Cu greatly reduces the short-circuit current density of the cell. The simulation results predict that the short-circuit current density is to be decreased by 0.75 mA/cm$^2$, and the experimental result shows that the short-circuit current density is reduced by 1.36 mA/cm$^2$, which is greater than that from theoretical prediction.

Trapping effects of the common metals are analyzed below.

At present, a silicon wafer thickness of the finished cell is about 150 μm, and photon having a wavelength greater than 850 nm can effectively penetrate the thickness. In addition, because a forbidden band width of Si is 1.12 eV, photon having a wavelength greater than 1200 nm is difficult to excite electron-hole pairs. Therefore, mainly 850-1200 nm bands are considered for the light trapping effect. The following Table d shows interface reflectivity of different metals and market prices found in February 2022.

TABLE d

| Material | Simulation result of average reflectivity in the 850-1200 nm bands at an interface between silicon and material (%) | Price (yuan/ton) | Short-circuit current density simulation result (mA/cm$^2$) |
|---|---|---|---|
| Ag | 96.6 | 5,101,000 | 42.18 |
| Al | 80.7 | 22,800 | 42.04 |
| Cu | 91.6 | 70,970 | 42.09 |
| Mg | 80.2 | 50,800 | 41.91 |
| Cr | 22.3 | 67,100 | 41.17 |
| Mo | 33.2 | 370,000 | 41.29 |
| Ni | 38.8 | 180,200 | 41.35 |
| Sn | 51.9 | 339,000 | 41.52 |
| Ti | 18.1 | 80,000 | 41.17 |
| W | 21.6 | 171,500 | 41.20 |

It can be seen from the above Table d that reflectivity among different metals differ greatly. The four metals Ag/Al/Cu/Mg may obtain relatively ideal short-circuit current density results, and are used in the seed layer, so as to achieve the effective light trapping effect. Further analysis is as follows. Cu cannot be used as the seed layer because an important role of the seed layer is to block Cu. The chemical properties of Mg are excessively active, and therefore Mg is not a good choice. Ag is more expensive and is not a good choice either. Al is an ideal seed layer metal, which has an excellent back reflectivity effect, has relatively stable chemical properties, and has a low price that is only 1/223 of Ag and 1/3 of Cu.

However, pure Al used as the seed layer introduces another problem. The adhesion between Al and other metals is weak, the technology of using pure Al as the seed layer may cause product reliability not up to the standard, a case of alternating heat and cold or bending of the product or the stress of a solder joint in the component welding causes the Al to be separated from an external metal, resulting in falling and failure.

The bonding force between Al and Cu is poor, which easily causes fingers to fall in pieces. In order to resolve the problem, various improvement methods have been tried. For example, a contact area of the Al/substrate is increased, a sample is heated to promote intermetallic interdiffusion, a new material such as TiW is added between Al/Cu materials, and the like, and but the effect is not ideal. Finally, it is found that if the improved component that can form good interconnection with Cu is directly added to the Al material as the seed layer, even additional annealing treatment is not required after Cu is electroplated. That is to say, desirable adhesion of the seed layer/electroplating layer has been formed, which greatly improves the adhesion of the electroplating layer, and eventually solves the problem.

The improved components such as Ni, Mo, Ti, and W, Cr, Mn, Pd, Bi, Nb, Ta, Pa, Si, and V obviously enhance the adhesion.

Further, Ni, Mo, Ti, W, Cr, Mn, Pd, Bi, Nb, Ta, Pa, and Si have low reflectivity. If excessive materials are added, the optical performance may be reduced. Using W as an example, it is simply assumed that the property of the alloy composition is an enhanced average value of the composition, and the calculation results shown in the following Table e are obtained.

TABLE e

| W content ratio (%) | Short-circuit current density of cell ($J_{sc}/cm^2$) |
|---|---|
| 100 | 40.8 |
| 90 | 40.92 |
| 80 | 41.04 |
| 70 | 41.16 |
| 60 | 41.28 |
| 50 | 41.4 |
| 40 | 41.52 |
| 30 | 41.64 |
| 20 | 41.76 |
| 10 | 41.88 |
| 0 | 42.00 |

When the W content is 30%, a current loss is 0.36 mA/cm², which causes a reduction in cell conversion efficiency by about 0.2%. Although the loss is relatively large, it is acceptable in terms of cost reduction brought about by replacement of Ag by Cu and the solution to the reliability problem. Therefore, it is considered that the improved component less than or equal to 30 wt. % of the seed layer is a recommended value.

Further, improved components in the seed layer may be unevenly distributed, so that better performance can be obtained. The principle is as follows. A part close to the substrate reduces the content of the improved component, which may enhance the reflection of the light, while a part in contact with the metal of the conductive layer may contain relatively higher content of the improved component, to improve the bonding force with the metal of the conductive layer.

The following Table f shows comparison of welding tension of different electrode technologies.

TABLE f

| Electrode technology | Welding tension (N/mm) |
|---|---|
| Conventional Ag electrode | 1.3 |
| Al + Cu electrode | 0.2 |
| Al + TiW +Cu electrode | 0.5 |
| Al alloy + Cu electrode in this patent | 0.6-1.7 (different improved components) |

It can be seen from the above Table f that the pure Al seed layer has relatively low finger tension and is much lower than that of a conventional Ag electrode, while the welding tension is improved after Al and Cu are directly added to the TiW material, but there are still shortcomings. In the disclosure, the solar cell made by using the Al alloy seed layer has even higher welding tension than the conventional Ag electrode.

Al is used as the main component to improve the adhesion between the seed layer and the Cu conductive layer and the light trapping effect of the solar cell. Table g lists data of the technical effects that can be brought by the combination of each single improved component and the main component Al:

TABLE g

| Material of seed layer | | Tension N/mm | Determination as to tension | Cell conversion efficiency (%) | Determination as to efficiency |
|---|---|---|---|---|---|
| Conventional Ag electrode | | 1.3 | / | 25.43 | / |
| Al | | 0.2 | Too low to satisfy reliability requirements | 25.62 | |
| Al alloy seed layer | W | 1.7 | Significantly improved compared with pure Al | 25.52 | Efficiency loss <0.3%, as expected |
| | Ti | 1.2 | Significantly improved compared with pure Al | 25.47 | Efficiency loss <0.3%, as expected |
| | Mo | 1.4 | Significantly improved compared with pure Al | 25.49 | Efficiency loss <0.3%, as expected |
| | Ni | 1.5 | Significantly improved compared with pure Al | 25.56 | Efficiency loss <0.3%, as expected |
| | Si | 1.1 | Significantly improved compared with pure Al | 25.42 | Efficiency loss <0.3%, as expected |
| | Cr | 0.9 | Significantly improved compared with pure Al | 25.44 | Efficiency loss <0.3%, as expected |
| | Ta | 2.1 | Significantly improved compared with pure Al | 25.39 | Efficiency loss <0.3%, as expected |
| | Mn | 0.7 | Significantly improved compared with pure Al | 25.57 | Efficiency loss <0.3%, as expected |
| | Pd | 0.9 | Significantly improved compared with pure Al | 25.38 | Efficiency loss <0.3%, as expected |

TABLE g-continued

| Material of seed layer | Tension N/mm | Determination as to tension | Cell conversion efficiency (%) | Determination as to efficiency |
|---|---|---|---|---|
| Bi | 0.8 | Significantly improved compared with pure Al | 25.47 | Efficiency loss <0.3%, as expected |
| Nb | 0.6 | Significantly improved compared with pure Al | 25.34 | Efficiency loss <0.3%, as expected |
| Pa | 1 | Significantly improved compared with pure Al | 25.39 | Efficiency loss <0.3%, as expected |
| V | 1.7 | Significantly improved compared with pure Al | 25.48 | Efficiency loss <0.3%, as expected |

It may be learned from the above experimental data that Cr, Mn, Pd, Bi, Nb, Ta, Pa, Si, and V as improved components can also improve the adhesion between the seed layer and the Cu conductive layer and the light trapping effect of the solar cell. It should be emphasized that there are hundreds of combinations of any one or more of the improved components Mo, Ni, Ti, W, Cr, Mn, Pd, Bi, Nb, Ta, Pa, Si, or V combined with Al, and it is impossible for us to provide experimental comparative data for all compositions. Therefore, on the premise that the experimental data of Ni, Mo, Ti, W, Cr, Mn, Pd, Bi, Nb, Ta, Pa, Si, and V as individual improved components are given in the specific implementation, it is obvious that other improved components combined with the main component Al can also achieve the desired technical effect.

Further, a thickness of the seed layer is preferably greater than or equal to 30 nm. It is found by experiments that the seed layer having the thickness of 30 nm is sufficient to prevent the diffusion of the Cu metal. For the thickness less than or equal to 300 nm, the main consideration is to control the cost. For example, the seed layer made by physical vapor deposition. Even if Al is cheaper than other metals, the cost impact of the Al target material still cannot be ignored. A larger thickness of the seed layer leads to lower production capacity on the device side, which is not conducive to the promotion of mass production. Therefore, the thickness of the seed layer is preferably between 30 nm and 300 nm.

Further, in order to save the costs of the alloy target material and further limit the diffusion of Cu to the substrate, a transparent conductive oxide (TCO) layer may be added between the alloy seed layer and the substrate, and light in a long-wavelength band can pass through the TCO layer and can be effectively reflected at the interface of the alloy layer. In this way, ideal performance and reliability results can also be obtained.

It may be learned from the above Tables a, b, and c that adding the seed layer deposited in the disclosure between the copper conductive layer and the substrate can increase the bonding force between the copper conductive layer and the substrate, and can enhance the light trapping effect of the solar cell.

The seed layer is preferably formed on the substrate by using any of preparation methods such as the physical vapor deposition (comprising sputtering and evaporation), screen printing, chemical vapor deposition, electroplating, or chemical plating. The seed layer is preferably formed by stacking a plurality of sub-seed layers. More preferably, contents of main components in the sub-seed layers stacked along a direction facing away from the substrate gradually decrease. A high content of the main component in the sub-seed layer at a small distance from the substrate can enhance the reflective effect, thereby improving the light trapping effect of the solar cell. The sub-seed layer at a large distance from the substrate (closer to the conductive layer) has a high content of the improved component and a relatively low content of the main component, which can ensure the bonding force between the sub-seed layer and the conductive layer.

The thickness of the seed layer is preferably between 10 nm and 1000 nm, and more preferably, the thickness of the seed layer ranges from 30 nm to 300 nm.

The electrode provided in this embodiment is shown in FIG. 3, and further comprises a conductive layer 5 located above the seed layer 1. The material for making the conductive layer 5 comprises any one or more of Cu, Ag, or Al. A method for growing the conductive layer on the seed layer comprises any of electroplating, physical vapor deposition, screen printing, and chemical plating. The thickness of the conductive layer is preferably in a range of 1-800 μm, and more preferably, the thickness of the conductive layer ranges from 1 μm to 100 μm.

In order to protect the conductive layer, preferably, an upper portion of the conductive layer is covered with a protective layer 6. More preferably, the protective layer 6 is an Sn layer or an Ag layer. The protective layer 6 is preferably grown on the conductive layer 5 by electroplating or chemical plating.

As shown in FIG. 3, a passivation film 7 configured to protect the seed layer 1 is preferably formed between the seed layer 1 and the semiconductor region, an opening 2 is provided on the passivation film 7, and the seed layer 1 comes into contact with the semiconductor region through the opening 2. More preferably, a TCO thin film (not shown in the figure) is further disposed between the seed layer 1 and the passivation film 7, and the TCO thin film comes into contact with the semiconductor region through the opening provided on the passivation film. The semiconductor region then preferably comprises a tunnel oxide layer 8 and doped polysilicon 9.

The disclosure further provides a solar cell, which is manufactured by using the above manufacturing method.

The disclosure further provides a solar module, which is formed by electrically connecting a plurality of solar cells manufactured by using the manufacturing method.

The disclosure further provides a solar power generation system, comprising a plurality of solar modules that are electrically connected.

Based on the above, in the disclosure, the film layer is perforated in the first region and/or the second region of the solar cell where the electrode is to be disposed, and the seed layer is grown on the solar cell. The seed layer comes into conductive contact with the first region and/or the second region through the hole, which solves the contradiction between the electrode width and the damage of the film perforation. In this way, the electrode width may be greatly increased. On the one hand, the line resistance of the solar cell is reduced, and on the other hand, the problem that the finger falls off easily caused by an excessively narrow line width of the electroplated electrode for a long time is solved. In addition, streamlined electroplating is performed, by using the self-developed horizontal electroplating device, on a to-be-electroplated solar cell for which growth of the seed layer has been completed. In this way, the problem that scale electroplating is not applicable due to low efficiency of electroplating by vertical electroplating existing in the prior art is solved.

In order to facilitate better understanding of the beneficial effects of the disclosure, modeling calculation is first performed to evaluate the performance improvement in the solar cell that can be brought by the disclosure, specifically shown in the following Table h:

electrode is wide enough (preferably, the width is greater than 30 μm, and more preferably, the width is in a range of 80-400 μm), which may greatly increase the bonding force between the electrode and the seed layer and between the seed layer and the substrate.

The impact of the electrode width on the bonding force and reliability is stressed below.

Figure 6:
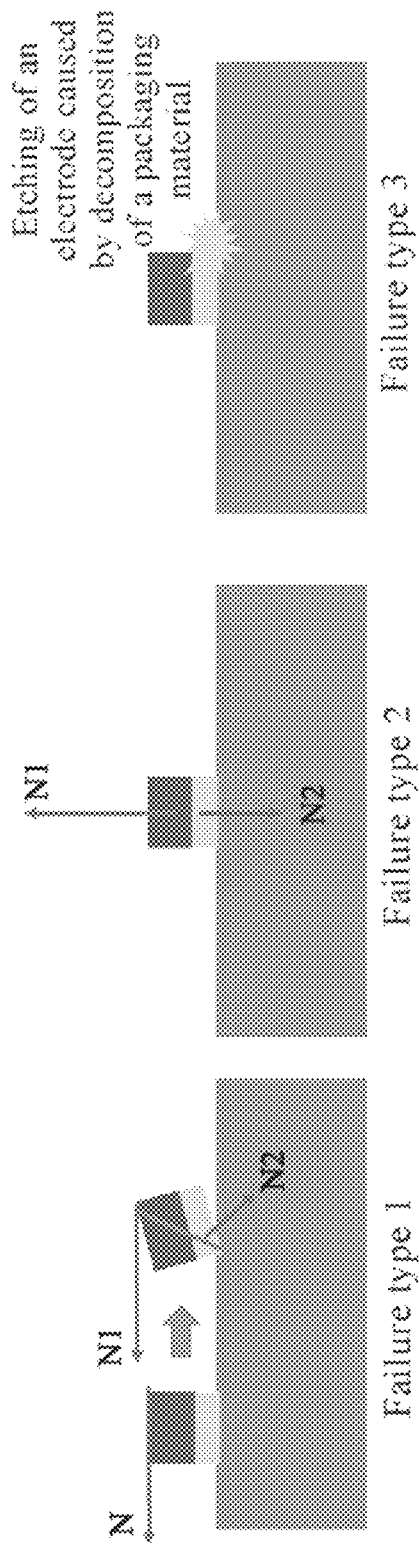
FIG. 6 is a schematic diagram of failure of an electrode falling off.

Referring to FIG. 6, there are three main mechanisms for failure of an electrode falling off.

1) Failure type 1 is a transverse force. In FIG. 6, N1 represents an external force, and N2 represents a bonding force. A larger electrode width leads to a smaller difference between arms of force of N2 and N1, which can reduce the risk of this type of failure.

2) Failure type 2 is vertical tension. A larger electrode width leads to a larger bonding area and a larger bonding force, which can reduce the risk of this type of failure.

3) Failure type 3 is etching of the electrode by water vapor and a decomposition product of a component packaging material. Ni, Mo, Ti, and the like are more active than Cu, especially acidic decomposition products gradually etch the seed layer during long-term aging, and the electrode width is excessively narrow, which affects the long-term aging performance of the product.

Another important factor limiting the mass production of the existing electroplating technology is one of excessively TABLE h Thickness of electroplating layer: 6 μm
Size of silicon wafer: 210
Loss at a position where film perforation is performed by laser: 100 fA/cm²

|  | Electrode width (μm) | Electrode resistance value (ohm · cm²) | Corresponding efficiency loss (%) | Front current density loss value ($J_{sc}$/cm²) | Corresponding efficiency loss (%) | Composite J0 (fA/cm²) | Corresponding efficiency loss (%) | Total loss (%) |
|---|---|---|---|---|---|---|---|---|
| The related art | 30 | 0.414 | 0.66 | 0.9 | 0.54 | 4.3 | 0.12 | 1.3 |
|  | 50 | 0.239 | 0.38 | 1.5 | 0.90 | 7.1 | 0.2 | 1.5 |
|  | 100 | 0.116 | 0.18 | 3 | 1.80 | 14.3 | 0.37 | 2.4 |
|  | 150 | 0.077 | 0.12 | 4.5 | 2.69 | 21.4 | 0.54 | 3.4 |
|  | 200 | 0.057 | 0.09 | 6 | 3.59 | 28.6 | 0.69 | 4.4 |
|  | 300 | 0.038 | 0.06 | 9 | 5.39 | 42.9 | 0.96 | 6.4 |
| This patent solution | 300 | 0.038 | 0.06 | 0 | 0 | 4.3 | 0.12 | 0.2 |

It can be seen from the above Table h that in the existing solution, with an increase in the electrode width, the loss of electrode resistance gradually decreases, but the efficiency loss caused by front side shading and recombination gradually increases, which forms a contradiction. The final conclusion is that a smaller electrode width leads to less loss, but even if the electrode width is reduced to 30 μm, the efficiency loss also reaches 1.3%. In addition, with the width, insufficient adhesion of the finger leads to a serious reliability problem, which is an important reason why the electroplating technology cannot be applied to mass production.

However, the disclosure solves the contradiction of the prior art. 1) No electrode is disposed on a front side of a back contact cell structure, which solves the shading loss of the electrode. 2) PVD is used to realize the growth of the seed layer, so that the electrode width can be larger than a film perforation size, and an ideal electrode width is obtained in a case that the laser damage is greatly reduced. 3) The low productivity, poor uniformity, or poor appearance/performance in the electrode clamping region, which are to be described below.

According to the existing technical solution, it is necessary to perform film perforation by laser under the electrode to expose the to-be-electroplated region, and then the cathode is connected to the film perforation region to form the cathode of the electroplating system on the substrate, which has the following problems.

Figure 7:
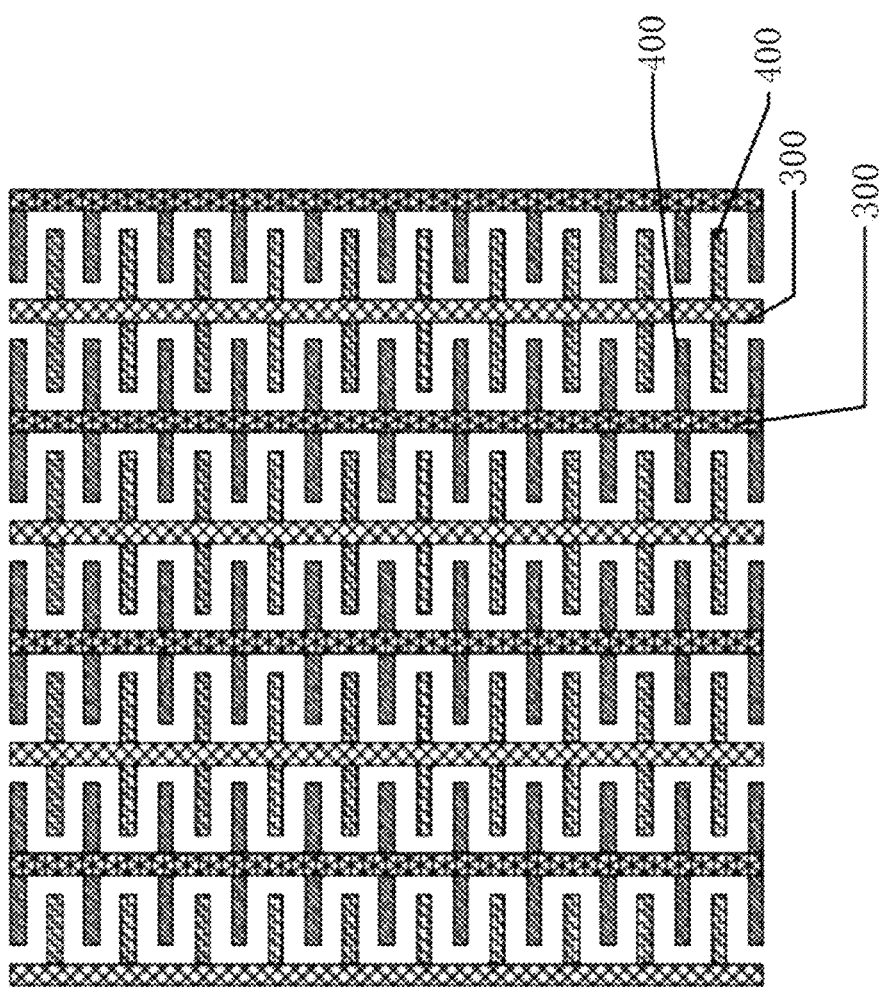
FIG. 7 is a schematic diagram of a connection structure of a busbar and a finger of a solar cell.

1) As shown in FIG. 7, four wide electrodes 300 vertically passing through the entire cell are referred to as busbars, and fine electrodes 400 among the busbars are referred to as fingers. The busbars are configured to gather currents collected by the fingers and be welded with ribbons. Therefore, a larger width is required. If the method of film perforation by laser and electroplating is used, the laser damage in this region is unacceptable. Therefore, some researchers choose to use Ag paste for the busbar as a compromise, and adopt the solution of electroplating for the finger. However, because the Ag paste is still used, the cost reduction is limited.

Figure 8:
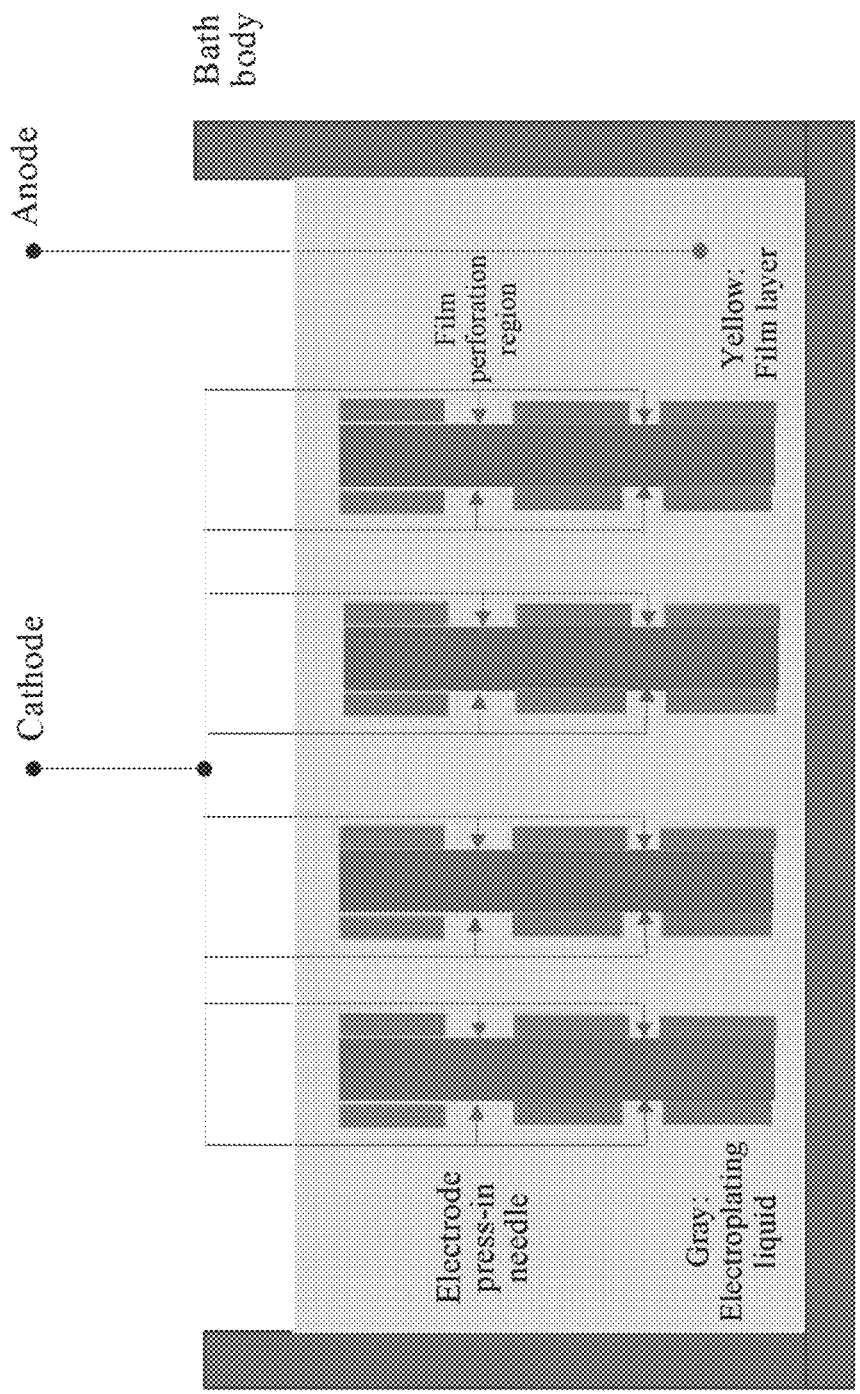
FIG. 8 is a schematic diagram of an existing electrode electroplating method.

2) The existing method for electroplating electrodes of the solar cell is shown in FIG. 8. A negative electrode fixture is required to clamp the solar cell (where press-in needles come into contact with the specially designed film perforation region), and then the cell is soaked in the plating bath having the seed layer made of Ni. The cell passes through a cleaning tank and is pulled to the sink for cleaning after plated by using Ni. The cell is pulled to an electroplating Cu bath for electroplating by using Cu after being cleaned. Then the cell is pulled to the sink for cleaning and then pulled to the Sn cell for Sn electroplating. In order to ensure the stability of the clamping and the relatively small stress, an area of a piezoelectric position of the electrode is required to be large enough, which causes regional laser damage loss and affects the appearance of the product. Due to the poor conductivity of the silicon wafer substrate, the non-uniformity of the surface potential affects the electroplating uniformity in the cell. In order to make up for this problem, a plurality of electrode press-in needles are often required to be disposed on each single cell, which may further exacerbate the foregoing impact. Since positions of bath bodies in different regions of the single cell and different cells are inconsistent, surface chemical concentrations are also different, which may cause differences in electroplating thicknesses of the product in and between cells. In addition, the limitation and the mechanical structure limit a number of cells clamped in a single slot, and the production capacity is limited. Therefore, it is difficult to support large-scale production.

Figure 9:
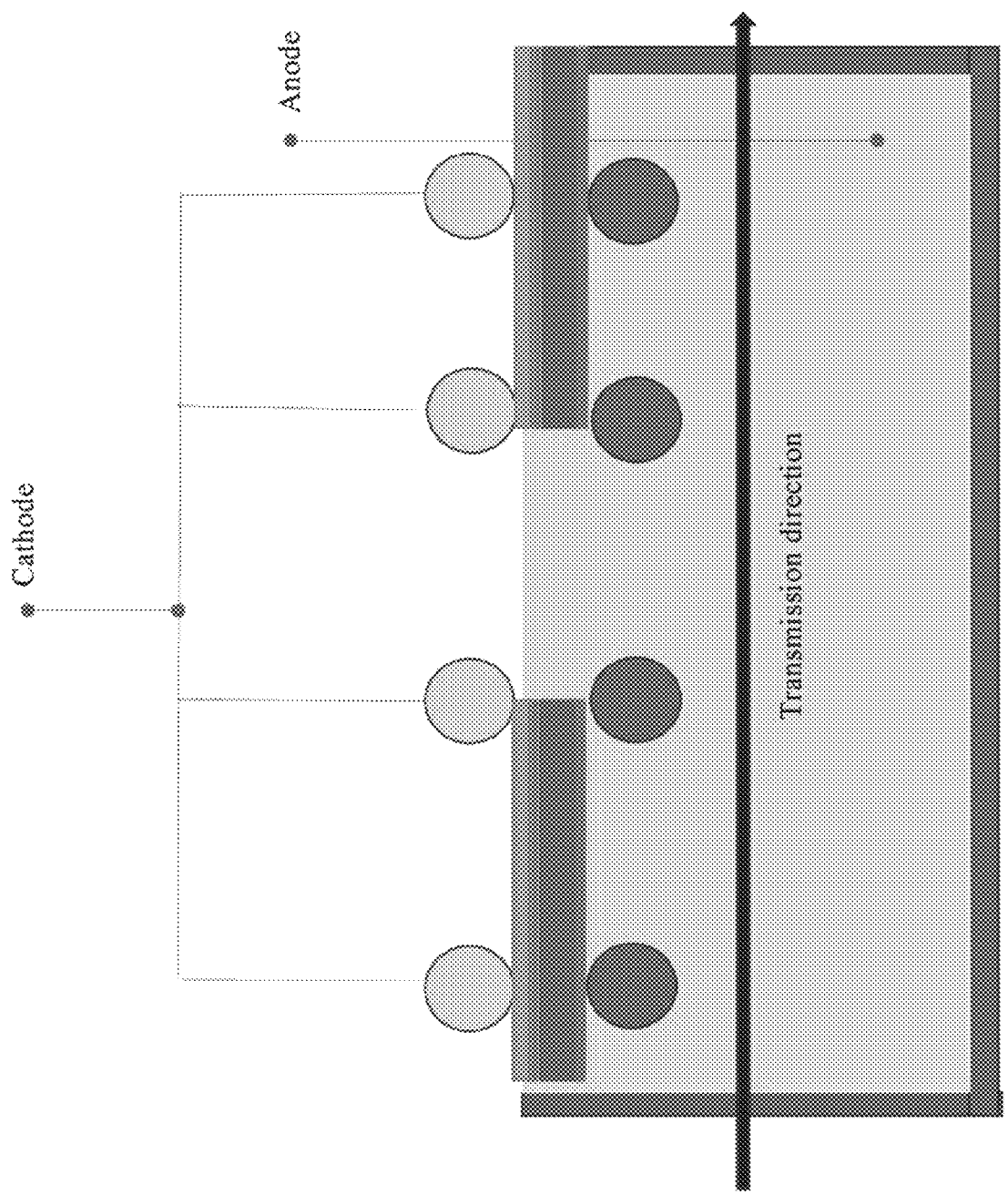
FIG. 9 is a schematic diagram of an electrode electroplating method according to the disclosure.

In the disclosure, the implementation of electrode electroplating is shown in FIG. 9. A plurality seed layers is grown on the back side of the cell, and the technology of physical vapor deposition is preferably used as a method for growing the seed layer. The seed layer may be partially removed after or before electroplating, but at least during the electroplating, a coverage area of the seed layer still accounts for more than 20% of the total area. At this point, the seed layer is to be on an outermost surface of the back side of the cell, so that the seed layer can be completely in good contact with a cathode electrode. Then the cell is in a horizontal chain transmission in the electroplating bath, rollers rotate to drive the cell to move, and the rollers on one side are made of a conductive material and form the cathode electrode of the electroplating system. The cell maintains continuous or almost continuous contact with the cathode electrode rollers during the horizontal transmission to achieve electroplating. The above electrode electroplating method has the following advantages. 1) It is only necessary to design a bath body having a suitable length to increase the transmission speed, thereby achieving an ideal output per unit time, and causing the cell to satisfy the requirement for large-scale mass production. 2) The seed layer has high conductivity, and the surface of the cell is evenly in contact with the liquid, which improves the uniformity and stability of the electroplating process. 3) A film perforation area by laser is independent of the electrode width, and additional film perforation by laser is not required for the busbar region and the cathode electrode contact region, which effectively reduces the laser loss.

According to the above description, practitioners in the industry may clearly realize that the following main beneficial effect of the disclosure is the organic combination of deposition of a large area of seed layer and the horizontal electroplating. If the existing seed layer electroplating technology is used, the cell cannot be in good contact with the cathode roller, resulting in the horizontal electroplating unable to be applicable to the manufacturing of the solar cell. If the existing vertical electroplating technology is used based on the deposition process of the large-area plurality seed layers, it will be difficult to achieve large-scale promotion of the electroplating technology due to problems such as stability, uniformity, low productivity, and the like.

Further, if the passivated contact technology is used for the region under the cell electrode, that is, the tunnel oxide layer and the polysilicon passivation layer are grown, a better effect can be obtained. The reason is as follows. 1) The seed layer is grown by means of the physical vapor deposition (especially sputtering), which easily causes bombardment damage on the surface, and the passivated contact structure on the substrate surface may effectively resist the bombardment damage. 2) The passivated contact structure may effectively reduce the damage of film perforation by laser. Therefore, the passivated contact structure and the technologies of growing the seed layer by physical vapor deposition and the horizontal electroplating is also an organic combination, which effectively solves the negative impact brought by the technologies of growing the seed layer by physical vapor deposition and the horizontal electroplating.

It is to be noted that the above specific implementations are merely preferred embodiments of the disclosure and applied technical principles. It should be understood by those skilled in the art that various modifications, equivalent replacements, changes, and the like may also be made to the disclosure. However, these modifications shall fall within the protection scope of the disclosure as long as they do not depart from the spirit of the disclosure. In addition, some terms used in the specification and claims of the disclosure do not constitute a limitation, but are only for convenience of description.

What is claimed is:

1. A method for manufacturing a solar cell, comprising:
   step S1: perforating a film layer in a first region and/or a second region of a solar cell comprising a substrate where an electrode is to be disposed, thus forming a plurality of holes or grooves;
   step S2: growing a seed layer on the solar cell, wherein the seed layer comes into conductive contact with the first region and/or the second region through the plurality of holes or grooves in step S1; and
   step S3: horizontally transporting a to-be-electroplated solar cell, wherein a cathode electroplating brush is in contact with the seed layer on the horizontally transported solar cell, to form a cathode of an electroplating system on the seed layer, an anode terminal is disposed in an electroplating liquid in an electroplating bath, and a moving mechanism disposed in the electroplating bath drives the solar cell to move from an inlet to an outlet of the moving mechanism of the solar cell, thus achieving electroplating of the solar cell during energization and the horizontal transportation to form an electroplated electrode region comprising electroplated electrodes;
   wherein:
   the seed layer comprises a main component and an additional component; the main component is Al having a mass content greater than or equal to 70 wt. % of the seed layer, and the additional component comprises any one or more of Mo, Ti, W, Pd, Bi, Nb, Ta, and Pa; and the additional component has a mass content less than or equal to 30 wt. % of the seed layer; and a conductive layer is disposed on the seed layer, and the conductive layer comprises Cu.

2. The method for manufacturing the solar cell of claim 1, wherein the first region or/and the second region is/are covered with a tunnel oxide layer and a polysilicon layer.

3. The method for manufacturing the solar cell of claim 1, wherein the seed layer is grown on the solar cell by means of physical vapor deposition.

4. The method for manufacturing the solar cell of claim 3, wherein in step S2, a transparent conductive oxide (TCO) thin film is grown by using a physical vapor deposition method before the seed layer is grown.

5. The method for manufacturing the solar cell of claim 1, wherein when the first region and the second region on the solar cell both exist on a back side of a silicon wafer, the method further comprises:
   step S4: after step S3, manufacturing a mask in an electroplated electrode region on the solar cell, etching the solar cell, and forming insulation between electroplated electrodes in the first region and the second region.

6. The method for manufacturing the solar cell of claim 4, wherein when the first region and the second region on the solar cell both exist on a back side of a silicon wafer, between step S2 and step S3, the method further comprises: forming a mask on the seed layer.

7. The method for manufacturing the solar cell of claim 6, wherein after step S3, the method further comprises: removing the mask layer on the seed layer, and then performing wet chemical etching to remove the seed layer.

8. The method for manufacturing the solar cell of claim 7, wherein the TCO thin film is removed during performing wet chemical etching to remove the seed layer.

9. The method for manufacturing the solar cell of claim 1, wherein when the first region and the second region on the solar cell both exist on a back side of a silicon wafer, after step S2, the method further comprises:
   step B1: forming a mask on the seed layer, and then performing wet chemical etching to realize insulation between a first portion of the seed layer in the first region and a second portion of the seed layer in the second region; and
   step B2: removing the mask on the seed layer.

10. The method for manufacturing the solar cell of claim 1, wherein the solar cell where an electrode is to be disposed is manufactured by using the following steps:
    step L1: texturing a surface of a silicon wafer;
    step L2: depositing a tunnel oxide layer on a back side of the silicon wafer, and then depositing first doped polysilicon having a first polarity on the tunnel oxide layer;
    step L3: depositing a first mask on the first doped polysilicon;
    step L4: retaining the first mask predisposed in the first region on the back side of the silicon wafer, and removing the first mask predisposed in the second region on the back side of the silicon wafer;
    step L5: removing the first doped polysilicon and the tunnel oxide layer deposited in the second region, and then manufacturing a second mask in the second region;
    step L6: depositing the tunnel oxide layer in the second region, and then depositing second doped polysilicon having a second polarity on the tunnel oxide layer in the second region;
    step L7: manufacturing a third mask on the second doped polysilicon deposited in the second region;
    step L8: retaining the third mask in a non-gap region in the second region, and removing the third mask outside a gap region in the second region;
    step L9: removing, by using a wet chemical method, the tunnel oxide layer and the second doped polysilicon deposited in the gap region on the back side of the silicon wafer; and
    step L10: performing a double-sided coating on the silicon wafer to obtain the solar cell where the electrode is to be disposed.

11. The method for manufacturing the solar cell of claim 1, wherein the seed layer is formed on the substrate by using physical vapor deposition manufacturing method, or screen printing manufacturing method, or chemical vapor deposition manufacturing method, or electroplating manufacturing method, or chemical plating manufacturing method, or ion plating manufacturing method.

12. The method for manufacturing the solar cell of claim 1, wherein a passivation film is formed between the seed layer and a semiconductor region where an electrode is disposed; and an opening is provided on the passivation film, and the seed layer comes into contact with the semiconductor region through the opening.

13. The method for manufacturing the solar cell of claim 12, wherein a transparent conductive oxide (TCO) thin film is further disposed between the seed layer and the passivation film, and the TCO thin film comes into contact with the semiconductor region through the opening provided on the passivation film.

14. The method for manufacturing the solar cell of claim 13, wherein the TCO thin film is an indium tin oxide or a zinc oxide-based thin film.

15. The method for manufacturing the solar cell of claim 12, wherein the semiconductor region comprises a tunnel oxide layer and doped polysilicon.

16. The method for manufacturing the solar cell of claim 1, wherein a method for growing the conductive layer on the seed layer comprises any of electroplating, physical vapor deposition, screen printing, and chemical plating.

17. The method for manufacturing the solar cell of claim 1, wherein an upper portion of the conductive layer is covered with a protective layer.

18. The method for manufacturing the solar cell of claim 17, wherein the protective layer is an Sn layer or an Ag layer, and the protective layer is grown on the conductive layer by electroplating or chemical plating.

19. The method for manufacturing the solar cell of claim 1, wherein the seed layer is formed by stacking a plurality of sub-seed layers, and contents of the main component in the sub-seed layers stacked decrease along a direction facing away from the substrate.

20. A method for manufacturing a solar cell, comprising:
    step S1: perforating a film layer in a first region and/or a second region of a solar cell comprising a substrate where an electrode is to be disposed, thus forming a plurality of holes or grooves;
    step S2: growing a seed layer on the solar cell, wherein the seed layer comes into conductive contact with the first region and/or the second region through the plurality of holes or grooves in step S1; and
    step S3: horizontally transporting a to-be-electroplated solar cell, wherein a cathode electroplating brush is in contact with the seed layer on the horizontally transported solar cell, to form a cathode of an electroplating system on the seed layer, an anode terminal is disposed in an electroplating liquid in an electroplating bath, and a moving mechanism disposed in the electroplating bath drives the solar cell to move from an inlet to an outlet of the moving mechanism of the solar cell, thus achieving electroplating of the solar cell during energization and the horizontal transportation to form an electroplated electrode region comprising electroplated electrodes;

wherein:

a conductive layer is disposed on the seed layer, and the conductive layer consists of Cu; and the seed layer comprises a main component and an additional component; the main component is Al having a mass content greater than or equal to 70 wt. % of the seed layer, and the additional component comprises any one or more of Mo, Ti, Pd, Bi, Nb, Ta, and Pa; and the additional component has a mass content less than or equal to 30 wt. % of the seed layer, thereby providing adhesion of the seed layer to the conductive layer.

21. A method for manufacturing a solar cell, comprising:

step S1: perforating a film layer in a first region and/or a second region of a solar cell comprising a substrate where an electrode is to be disposed, thus forming a plurality of holes or grooves;

step S2: growing a seed layer on the solar cell, wherein the seed layer comes into conductive contact with the first region and/or the second region through the plurality of holes or grooves in step S1; and step S3: horizontally transporting a to-be-electroplated solar cell, wherein a cathode electroplating brush is in contact with the seed layer on the horizontally transported solar cell, to form a cathode of an electroplating system on the seed layer, an anode terminal is disposed in an electroplating liquid in an electroplating bath, and a moving mechanism disposed in the electroplating bath drives the solar cell to move from an inlet to an outlet of the moving mechanism of the solar cell, thus achieving electroplating of the solar cell during energization and the horizontal transportation to form an electroplated electrode region comprising electroplated electrodes;

wherein:

the seed layer comprises a main component and an additional component; the main component is Al having a mass content greater than or equal to 70 wt. % of the seed layer, and the additional component comprises any one or more of W, Cr, Mn, Pd, Bi, Nb, Ta, and Pa; and the additional component has a mass content less than or equal to 30 wt. % of the seed layer; and a conductive layer is disposed on the seed layer, and the conductive layer comprises Cu.

22. A method for manufacturing a solar cell, comprising:

step S1: perforating a film layer in a first region and/or a second region of a solar cell comprising a substrate where an electrode is to be disposed, thus forming a plurality of holes or grooves;

step S2: growing a seed layer on the solar cell, wherein the seed layer comes into conductive contact with the first region and/or the second region through the plurality of holes or grooves in step S1; and step S3: horizontally transporting a to-be-electroplated solar cell, wherein a cathode electroplating brush is in contact with the seed layer on the horizontally transported solar cell, to form a cathode of an electroplating system on the seed layer, an anode terminal is disposed in an electroplating liquid in an electroplating bath, and a moving mechanism disposed in the electroplating bath drives the solar cell to move from an inlet to an outlet of the moving mechanism of the solar cell, thus achieving electroplating of the solar cell during energization and the horizontal transportation to form an electroplated electrode region comprising electroplated electrodes;

wherein:

the seed layer consists of a main component and an additional component; the main component is Al having a mass content greater than or equal to 70 wt. % of the seed layer, and the additional component is a metal selected from Mo, Ti, W, Cr, Mn, Pd, Bi, Nb, Ta, and Pa; and the additional component has a mass content less than or equal to 30 wt. % of the seed layer; and a conductive layer is disposed on the seed layer, and the conductive layer comprises Cu.

* * * * *